United States Patent
Shibazaki et al.

(10) Patent No.: US 11,418,101 B2
(45) Date of Patent: Aug. 16, 2022

(54) LINEAR MOTOR FOR VACUUM AND VACUUM PROCESSING APPARATUS

(71) Applicant: Hitachi High-Technologies Corporation, Tokyo (JP)

(72) Inventors: Tomotaka Shibazaki, Tokyo (JP); Masaki Mizuochi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 248 days.

(21) Appl. No.: 16/600,010

(22) Filed: Oct. 11, 2019

(65) Prior Publication Data

US 2020/0126749 A1   Apr. 23, 2020

(30) Foreign Application Priority Data

Oct. 18, 2018   (JP) .............................. JP2018-196327

(51) Int. Cl.
*H02K 41/03*   (2006.01)
*H02K 5/10*   (2006.01)
(Continued)

(52) U.S. Cl.
CPC ............. *H02K 41/031* (2013.01); *H02K 5/10* (2013.01); *H02K 5/20* (2013.01); *H02K 5/225* (2013.01);
(Continued)

(58) Field of Classification Search
CPC ........ H02K 41/00; H02K 41/02; H02K 41/03; H02K 5/10; H02K 5/20; H02K 5/225;
(Continued)

(56) References Cited

U.S. PATENT DOCUMENTS

| 9,300,181 B2 | 3/2016 | Maeda et al. |
| 2005/0213060 A1* | 9/2005 | Duisters .............. G03F 7/70983 355/30 |
| 2008/0212042 A1* | 9/2008 | Morimoto ........... G03F 7/70758 355/30 |

FOREIGN PATENT DOCUMENTS

| JP | 2014-128177 A | 7/2014 |
| JP | 2018151359 | * 8/2018 |

(Continued)

OTHER PUBLICATIONS

Schiller et al., Machine Translation of WO2008006809, Jan. 2008 (Year: 2008).*

*Primary Examiner* — Quyen P Leung
*Assistant Examiner* — Eric Johnson
(74) *Attorney, Agent, or Firm* — Crowell & Moring LLP

(57) ABSTRACT

Since wires connected to a linear motor are routed in a vacuum sample chamber, outgassing is generated from wire coating and efficiency of assembly operations is reduced. Further, there is a problem that thrust generation efficiency of the linear motor is reduced when a gap between a coil and a permanent magnet of the linear motor cannot be small. In order to solve the above problems, a linear motor for vacuum is provided, the linear motor for vacuum including: a mover having a permanent magnet; and a stator having a support member to which a coil is fixed, in which the support member includes a vacuum sealing portion that vacuum seals with a wall surface of a vacuum sample chamber, and a feed-through for supplying a current to the coil provided in the vacuum sample chamber.

5 Claims, 8 Drawing Sheets

(51) Int. Cl.
  *H02K 5/20*  (2006.01)
  *H02K 5/22*  (2006.01)
  *H01J 37/02*  (2006.01)
  *H01J 37/26*  (2006.01)
  *H01J 37/18*  (2006.01)

(52) U.S. Cl.
  CPC ............ *H01J 37/023* (2013.01); *H01J 37/18* (2013.01); *H01J 37/26* (2013.01); *H01J 2237/002* (2013.01); *H01J 2237/20235* (2013.01)

(58) Field of Classification Search
  CPC .......... H01J 37/023; H01J 37/18; H01J 37/26; H01J 2237/002; H01J 2237/20235
  USPC ............................................. 310/12.05–12.6
  See application file for complete search history.

(56) References Cited

FOREIGN PATENT DOCUMENTS

| | | | | |
|---|---|---|---|---|
| WO | WO-2008006809 A1 | * | 1/2008 | ............... H02K 5/12 |
| WO | WO-2020031657 A1 | * | 2/2020 | ............. H02K 41/03 |

* cited by examiner

[FIG. 1]
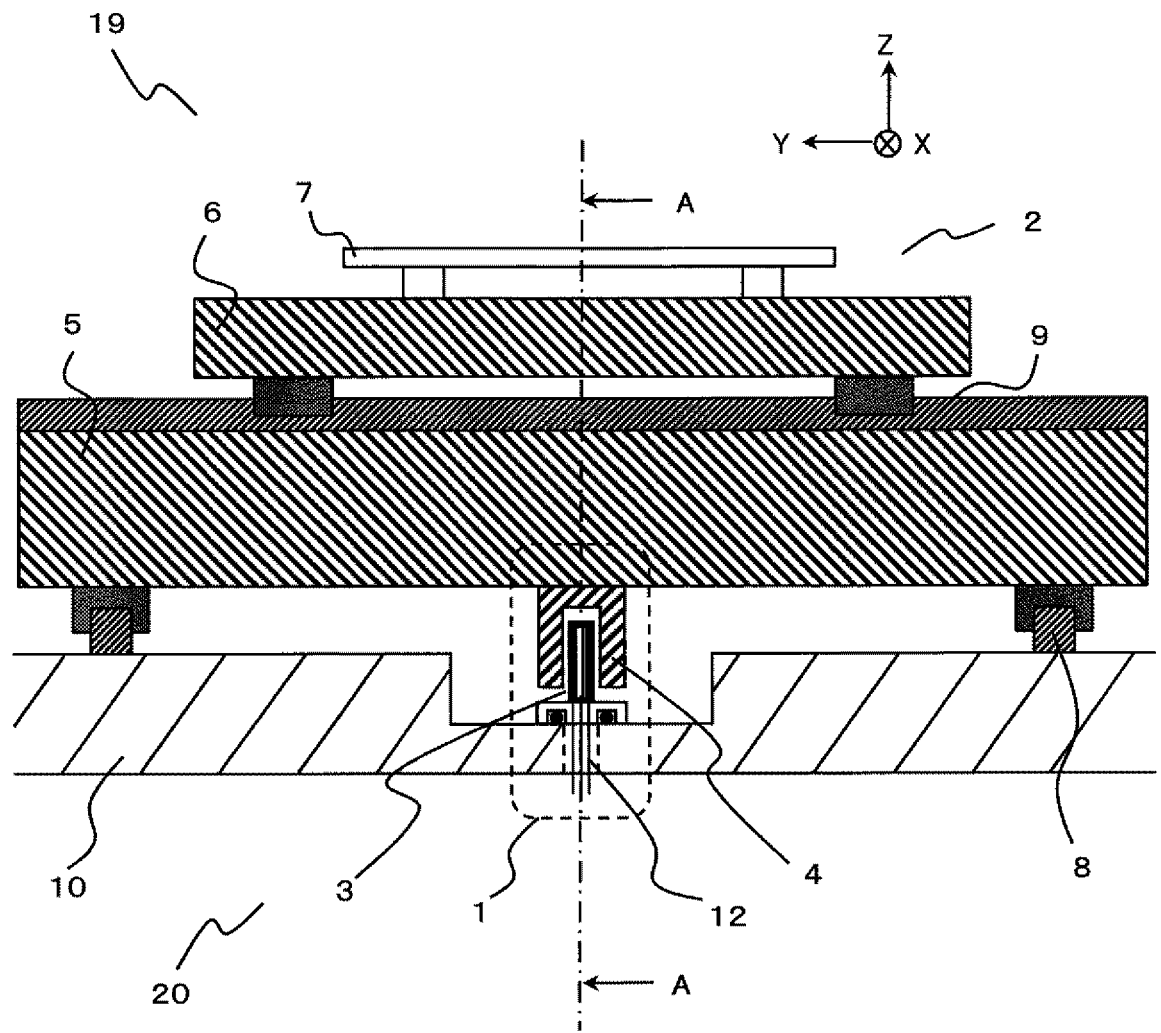

[FIG. 2]
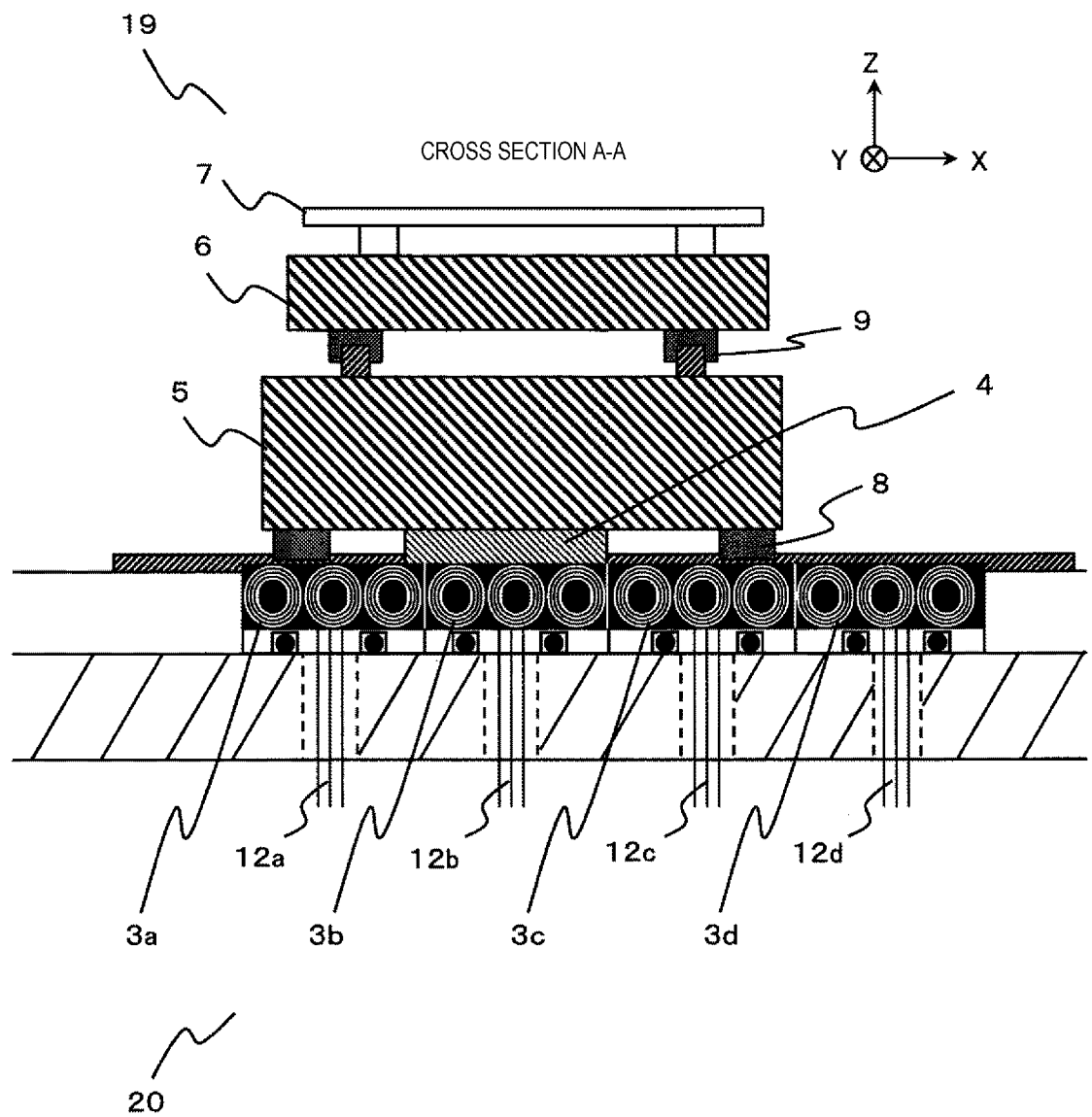

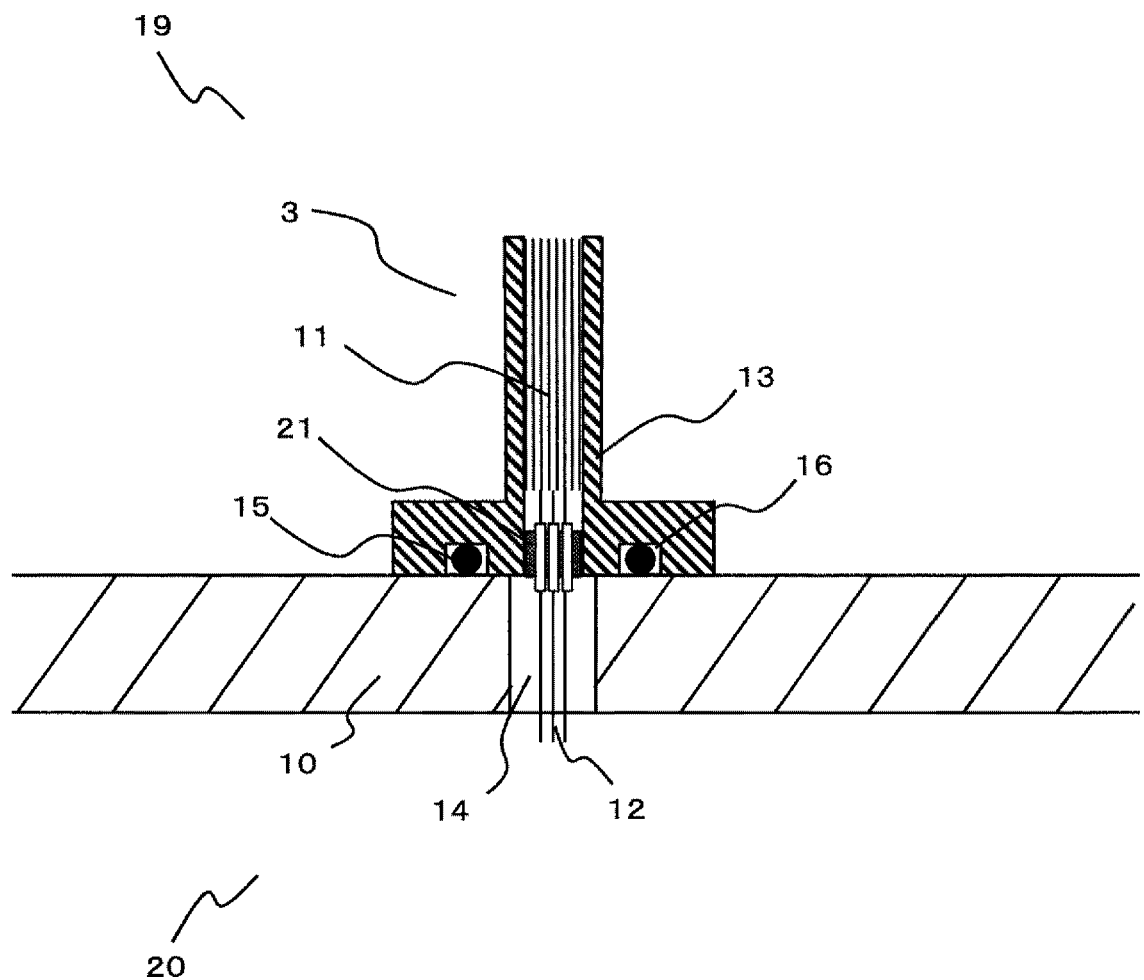

[FIG. 4]
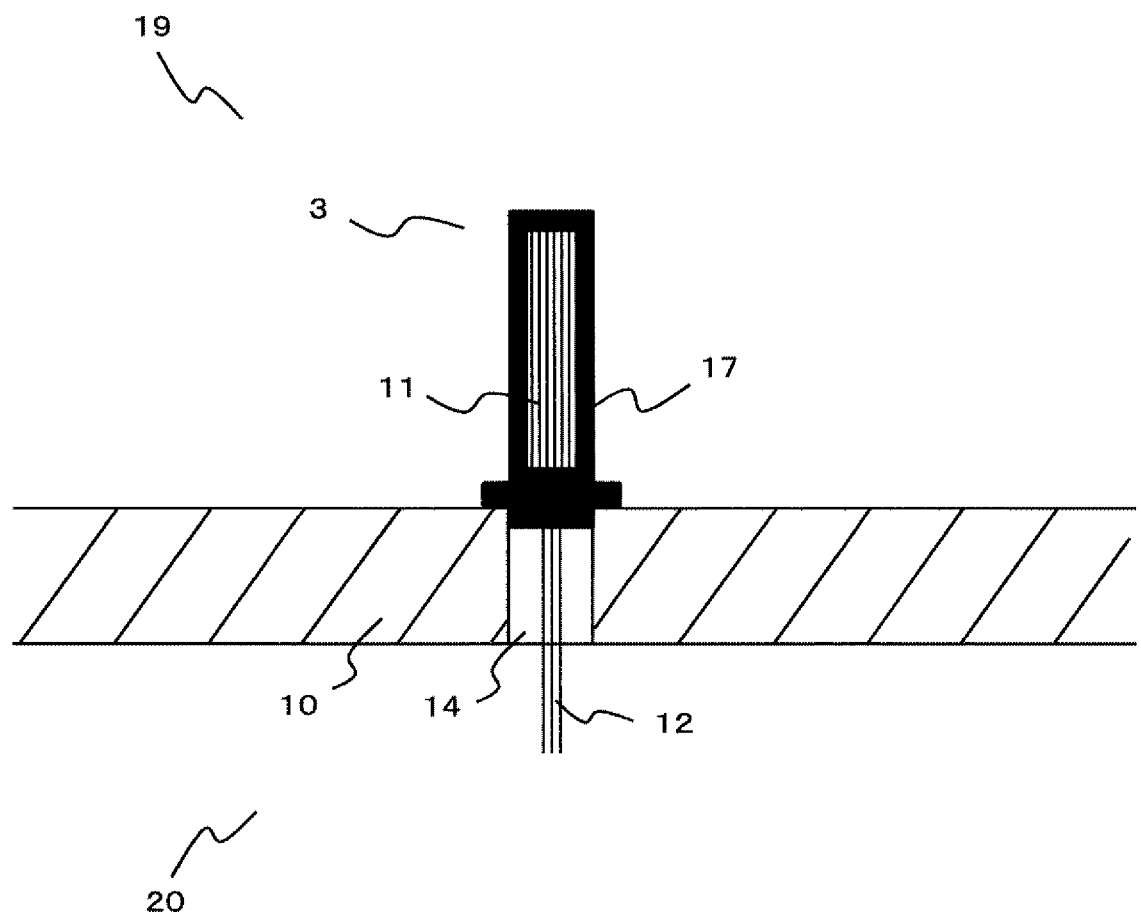

[FIG. 5]
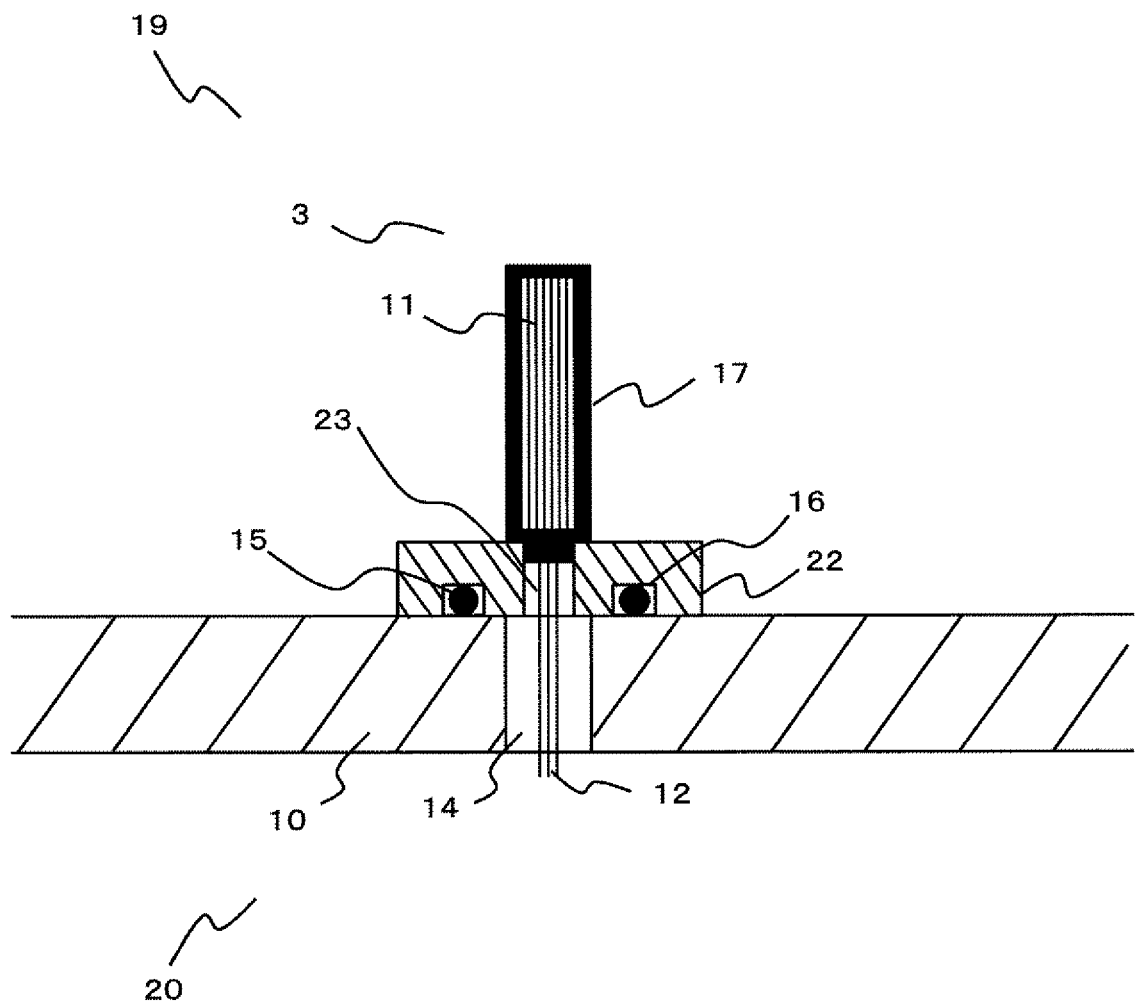

[FIG. 6]
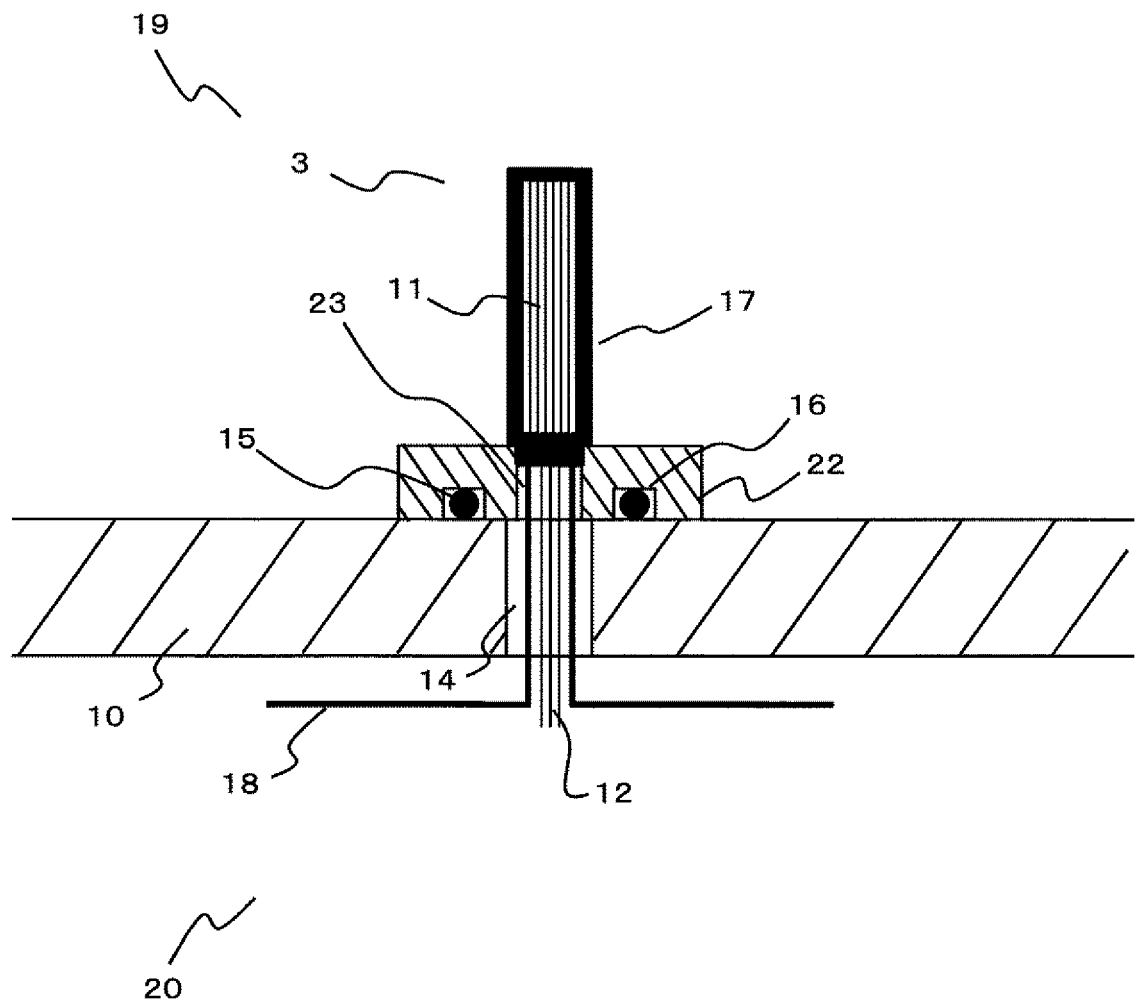

[FIG. 7]
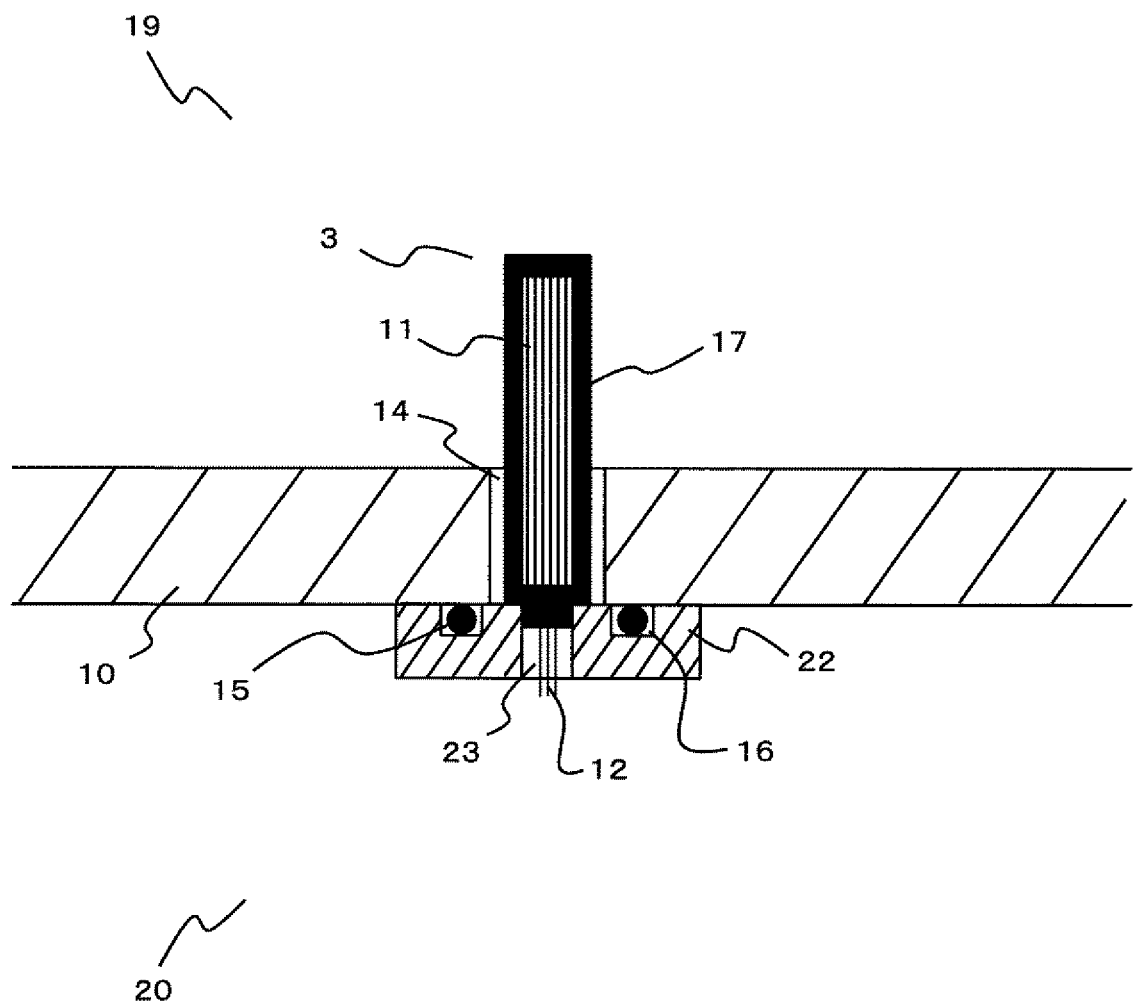

[FIG. 8]
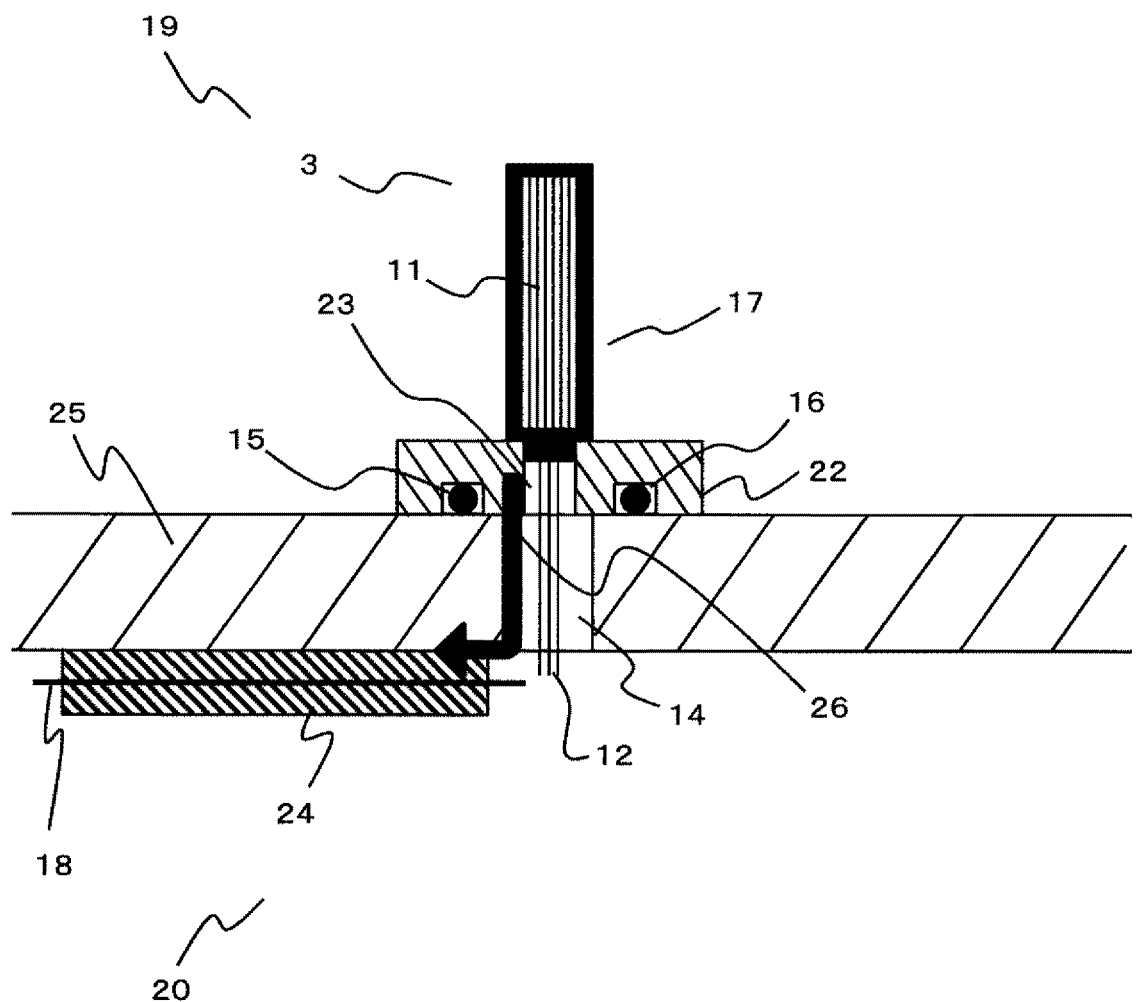

LINEAR MOTOR FOR VACUUM AND VACUUM PROCESSING APPARATUS

TECHNICAL FIELD

The present invention relates to a linear motor for driving a sample stage in a vacuum sample chamber.

BACKGROUND ART

In a vacuum processing apparatus, represented by an electron microscope, an ion beam apparatus, a semiconductor manufacturing apparatus, and a semiconductor measurement and inspection apparatus, in which a sample is observed, inspected, measured, analyzed, processed and conveyed (hereinafter referred to as "processing") in a vacuum space, it is normal to perform various processing on a target sample while moving the sample to be processed by a movable stage. A linear motor is employed as a driving mechanism for realizing high speed movement and high precision positioning of the movable stage used in the vacuum processing apparatus. The linear motor includes a moving magnet type linear motor. The moving magnet type linear motor includes a mover having a permanent magnet and a stator having a coil through which a control current passing, and there is no need for power supply wires to movable portions, so that it suitable for a case where it is desired to reduce a risk of disconnection and foreign matter generation caused by movement of the power supply wires.

PRIOR ART LITERATURE

Patent Literature

PTL 1: JP-A-2014-128177

SUMMARY OF INVENTION

Technical Problem

Meanwhile, the moving magnet type linear motor using the coil as the stator requires a coil whose length corresponds to a movable stroke of a stage. That is, if the stroke is intended to be long, the number of the coils needs to be increased accordingly, and therefore the number of wires to be introduced into a vacuum chamber in an electron microscope tends to increase. The increase in the number of the wires in the vacuum sample chamber leads to problems such as an increase in the number of assembly operations, an increase in cost, and an increase in an amount of outgassing generated from wire coating. In order to solve these problems, PTL 1 discloses a linear motor in which an entire coil on a stator side is covered by a packaging member having a vacuum sealing structure, and a space between a mover having a permanent magnet and a stator having a coil is airtightly separated.

However, in the technology disclosed in PTL 1, since the stator having the coil is disposed in an atmospheric environment, and the mover having the permanent magnet is disposed in a vacuum environment, the packaging member is required to separate the space between the coil and the permanent magnet, and a gap greater than or equal to a thickness of the packaging member is generated between the coil and the permanent magnet. For example, in the vacuum sample chamber of the electron microscope, a high vacuum of 10-5 Pa may be required, and in order to secure a mechanical strength of the packaging member for separating the vacuum environment and the atmospheric environment, a stainless packaging member requires to a thickness of several centimeters. In the linear motor, thrust efficiency decreases as the gap between the coil and the permanent magnet increases, and therefore, when a distance between the stator and the mover is more than several centimeters, there is a problem that thrust generation efficiency of the linear motor is significantly reduced.

The invention is made in view of the above problems, and an object thereof is to provide a linear motor capable of improving the thrust generation efficiency while reducing the amount of the outgassing generated from wire coating and the number of assembly operations of the linear motor.

Solution to Problem

In order to the above problems, a linear motor for vacuum is provided, the linear motor for vacuum including: a mover having a permanent magnet; and a stator having a support member to which a coil is fixed, in which the support member includes a vacuum sealing portion that vacuum seals with a wall surface of a vacuum sample chamber, and a feed-through for supplying a current to the coil provided in the vacuum sample chamber.

A linear motor for vacuum is further provided, the linear motor for vacuum including: a mover having a permanent magnet; and a stator having a coil covered by a resin member, in which the stator includes a support member having a vacuum sealing portion that vacuum seals with a wall surface of a vacuum sample chamber and a first through hole portion, and a wire for supplying a current to the coil provided in the vacuum sample chamber. The wire is led out to an outside of the vacuum sample chamber through the first through hole portion. The first through hole portion is filled with the resin member integrally or with a filler that binds to the resin member, so that the through hole portion is sealed.

Further, a vacuum processing apparatus including a linear motor for vacuum is provided. The linear motor for vacuum includes a mover having a permanent magnet, a stator having a coil covered by a resin member, and a wire for supplying a current to the coil provided in a vacuum sample chamber. The wire is led out to an outside of the vacuum sample chamber through a through hole portion provided in the wall surface of the vacuum sample chamber. The through hole portion is filled with the resin member integrally or with a filler that binds to the resin member, that the through hole portion is sealed.

Advantageous Effect

According to the above configuration, it is possible to implement a linear motor capable of preventing outgassing generated from wire coating in a vacuum sample chamber, and having excellent assembly operation efficiency and maintainability and high thrust generation efficiency, and a vacuum processing apparatus using the linear motor.

BRIEF DESCRIPTION OF DRAWINGS

FIG. 1 is a view illustrating a sample stage which uses a linear motor of a first embodiment as a drive source.

FIG. 2 is a cross-sectional view of the stage of FIG. 1 taken along a line A-A.

FIG. 3 is a view illustrating the configuration of a peripheral portion of a stator according to the first embodiment.

FIG. 4 is a view illustrating the configuration of a peripheral portion of a stator according to a second embodiment.

FIG. 5 is a view illustrating the configuration of a peripheral portion of a stator according to a third embodiment.

FIG. 6 is a view illustrating the configuration of a peripheral portion of a stator according to a forth embodiment.

FIG. 7 is a view illustrating the configuration of a peripheral portion of a stator according to a fifth embodiment.

FIG. 8 is a view illustrating the configuration of a peripheral portion of a stator according to an embodiment of the invention.

DESCRIPTION OF EMBODIMENTS

Hereinafter, embodiments will be described with reference to accompanying drawings. In the accompanying drawings, elements with the same functions may be denoted by the same number. Although the attached drawings show specific embodiments in accordance with the principles of the disclosure, they are for the purpose of understanding the disclosure, and are not to be used for limiting interpretation of the disclosure. The descriptions in this specification are merely exemplary, and are not intended to limit the scope of the claims or application in any way whatsoever.

This embodiment has been described in sufficient detail for those skilled in the art to practice the present disclosure, but other implementations are possible and do not depart from the scope and spirit of the technical idea of the present disclosure. It is necessary to understand that it is possible to change the composition/structure and replace various elements. Therefore, the following description should not be interpreted as being limited to this.

In the following embodiments, a linear motor used for a sample stage in, for example, an electron microscope will be described as an example, the invention is not limited thereto, and can be applied to a vacuum processing apparatus, represented by an electron microscope, an ion beam apparatus, a semiconductor manufacturing apparatus, and a semiconductor measurement and inspection apparatus in which a sample is observed, inspected, measured, analyzed, processed, and conveyed in a vacuum space.

First Embodiment

Hereinafter, an embodiment of the invention will be described with reference to FIGS. 1 to 3.

FIG. 1 illustrates a configuration example of a sample stage driven by a linear motor in a vacuum sample chamber of an electron microscope or the like. A space of a vacuum sample chamber inside 19 and an atmospheric environment 20 are separated by a vacuum sample chamber wall 10. A sample stage 2 includes an X movable table 5, a Y movable table 6, an X roller guide 8 and a Y roller guide 9 for moving each table linearly in respective axial directions, and a chuck 7 for fixing a sample. A stator 3 and the vacuum sample chamber wall 10 are mechanically fixed by screws or the like. The X movable table 5 and a mover flare mechanically fixed by screws or the like, and thrust of a linear motor 1 is transmitted to the X movable table 5. The linear motor 1 includes a stator 3 having a coil and a mover 4 having a magnet, and is disposed at the vacuum sample chamber inside 19.

FIG. 2 is a cross-sectional view of the sample stage of FIG. 1, and a cross-sectional position and a direction are taken along a line A-A in FIG. 1. In this embodiment, the stator 3 is a common design, and a plurality of the stators 3 are combined according to a desired stroke of the sample stage 2, and the embodiment of FIG. 2 illustrate an example in which four common design stators 3a, 3b, 3c, and 3d are arranged in the X direction. In this way, the stator can be commonly designed and a plurality of stators are used in combination according to the stroke, so that it is not necessary to prepare a stator having a new length for each sample stage with a different stroke, and a cost reduction effect can be expected when a sample stage of multiple types is desired to be manufactured. Meanwhile, since a stroke of the sample stage 2 is determined by the number of the stators 3, when the stroke is increased, the number of the wires 12 connected to the stator 3 also increases with the increase of the number of the stators 3. In FIG. 2, since four stators 3a, 3b, 3c, and 3d are arranged in the X direction of the sample stage 2, four wires 12a, 12b, 12c, and 12d are required for respective stators. If the number of the wires increases in the vacuum sample chamber inside 19, it would cause problems of an increase of outgassing from wire coating and an increase in the number of assembly operations. An embodiment of the invention for solving the problems will be described with reference to FIG. 3.

FIG. 3 illustrates an example of a peripheral portion of the stator according to the embodiment of the invention. The stator 3 includes a coil 11, a supporting member 13, wires 12 for connecting to the coil 11, and a vacuum feed-through 21 for taking the wires 12 out of the vacuum sample chamber inside 19 to the atmospheric environment. The vacuum feed-through 21 that separates the vacuum sample chamber inside 19 and the atmospheric environment 20 from each other may be made of resin. The support member 13 and the coil 11 are fixed to each other by an adhesive or the like. The support member 13 is made of metal or resin. Epoxy resin is an example of the resin that can be used for forming the vacuum feed-through 21 and fixing the coil 11. Since the epoxy resin is available in adhesive type and can be cured to a desired shape after covering the corresponding portion, it also can be easy to form the vacuum feed-through 21 and to fix the support member 13 and the coil 11.

In the support member 13 of the stator 3, a hole for fixing the screw by which the stator 3 is attached to the vacuum sample chamber wall 10 is formed (not shown). The stator 3 is configured to be screwed to the vacuum sample chamber wall 10, so that it is possible to singly attach and detach the stator 3, and to easily perform component replacement. The support member 13 of the stator 3 is provided with a vacuum sealing structure. An example of the vacuum sealing structure is a sealing structure with an O-ring. In the embodiment of FIG. 3, an O-ring groove 16 for attaching an O-ring 15 to the support member 13 is provided, and a sealing surface is formed on an O-ring contact surface of the O-ring groove 16 by machining or the like, and a sealing surface is also formed on a surface of the vacuum sample chamber wall 10 that is also in contact with the O-ring 15. A through hole 14 for taking the wires 12 to a side of the atmospheric environment 20 is formed in the vacuum sample chamber wall 10.

According to the above configuration, in the related art, the wires 12 to the stator 3 that is routed in the vacuum sample chamber can be directly taken out to the atmospheric environment, so that the outgassing generated from the wire coating in the vacuum sample chamber can be prevented. Further, since the wire to the linear motor does not require to be taken into the vacuum sample chamber, efficiency of assembly operations is improved. Further, the stator having the coil 3 and the mover having the permanent magnet are not required to be separated spatially, and are both disposed in the vacuum sample chamber, so that a linear motor with a small gap between the coil and the permanent magnet can be realized, and thrust generation efficiency of the linear motor can be improved. Further, single component replacement can be performed on the stator 3, so that workability such as maintenance is excellent.

Further, as will be described later in a fourth embodiment, the vacuum feed-through 21 may be configured to supply a cooling fluid for cooling the coil. In this case, the same effects as those described in the fourth embodiment can be obtained.

Second Embodiment

FIG. 4 illustrates the configuration of a peripheral portion of a stator according to another embodiment of the invention. A stator 3 includes a coil 11, wires 12 for connecting to the coil 11, and resin 17. The resin 17 is configured to be a member that covers the coil 11, the wires 12 and a through hole 14, and separates a vacuum sample chamber inside 19 and an atmospheric environment 20 from each other. In other words, the through hole 14 is sealed by the resin 17, so that the airtightness between the vacuum sample chamber inside 19 and the atmospheric environment 20 is ensured. In addition, the coil 11 is covered with the resin 17 to ensure rigidity and to prevent a shape change of the coil 11, so that the performance of a linear motor can be stabilized over a long period. In this case, in order to support the coil 11, not only the resin 17 but also a new support member may be added. The shape of the resin 17 can be formed by a molding method such as injection molding or insert molding.

In this embodiment, compared with the first embodiment, although the singly component replacement cannot be performed, the cost of the linear motor can be reduced since the number of components on a side of the stator having the coil 11 can be reduced.

Third Embodiment

FIG. 5 illustrates the configuration of a peripheral portion of a stator in another embodiment of the invention. A stator 3 includes a coil 11, wires 12 for connecting to the coil 11, resin 17, and a support member 22. The resin 17 is configured to be a member that covers the coil 11, the wires 12 and a through hole 14 of the support member 22, and separates a vacuum sample chamber inside 19 and an atmospheric environment 20 form each other. That is, the through hole 14 is sealed by the resin 17, so that the airtightness between the vacuum sample chamber inside 19 and the atmospheric environment 20 is ensured. In addition, the coil 11 is covered with the resin 17 to ensure rigidity and to prevent a shape change of the coil 11, so that the performance of a linear motor can be stabilized over a long period. In the support member 22, a hole for fixing a screw by which the stator 3 is attached to a vacuum sample chamber wall 10 is formed (not shown), such that attachment and detachment of the stator 3 can be singly performed. Further, the support member 22 is provided with an O-ring groove 16 to which an O-ring 15 is attached, and a sealing surface is formed on an O-ring contact surface of the O-ring groove 16 by machining or the like. Similarly, a sealing surface is also formed on a surface of the vacuum sample chamber wall 10 that is also in contact with the O-ring 15. A vacuum sealing structure with the O-ring 15 maintains the airtightness between the support member 22 and the vacuum sample chamber wall 10.

In the present embodiment, the same effect as the first embodiment can be acquired.

Fourth Embodiment

FIG. 6 illustrates the configuration of a peripheral portion of a stator in another embodiment of the invention. The third embodiment is a configuration example in which a pipe 18 is further added for supplying a cooling fluid for cooling a coil 3. When heat of the coil is transmitted to a sample chamber or a movable table, an orientation change of the movable table or deformation of the movable table occurs. Such orientation change or deformation of the movable table causes a change in a stage coordinate measurement position or an electron beam irradiation position in the vacuum processing apparatus, which may cause deterioration in processing performance of the vacuum processing apparatus. Therefore, it can be said that suppressing heat generation of the coil generated during stage operations is a serious problem for achieving both acceleration of the stage (large current of the coil) and high accuracy of the stage. As an example of a cooling method of the vacuum sample chamber and the stage, as shown in FIG. 8, there is a method of disposing the pipe 18 for cooling fluid on a bottom surface 25 of an atmospheric side of the sample chamber. If the pipe 18 is covered with a metal jacket 24 so as to bring the pipe 18 in close contact with the sample chamber bottom surface 25, the pipe 18 can be mechanically fixed to the sample chamber bottom surface 25 by using screws or the like. However, in the configuration of FIG. 8, the heat, as shown in a heat flow 26, generated in the coil 11 is transmitted to the pipe 18 for cooling fluid via the sample chamber bottom surface 25, and thus, the heat is inevitably transmitted to the vacuum sample chamber or the movable table. Compared with the configuration of FIG. 8, in this embodiment of FIG. 6, since the pipe 18 for cooling fluid can be disposed closer the coil 11 which is a heat source, the heat generated in the coil 11 can be more directly released to the cooling fluid, and the heat transmission to the vacuum sample chamber can be suppressed. For example, water or an aqueous solution to which a specific substance is added is used as the cooling fluid. The stator 3 includes the coil 11, wires 12 for connecting to the coil 11, resin 17, a support member 21 and the pipe 18. A method in which the support member 22 is made of a cast-metal object is an example of a manufacturing method of the present embodiment shown in FIG. 6. If the pipe 18 for cooling that is processed to a size that fits in the support member 22 in advance is disposed in the cast-metal object, and a metal material used as the support member 22 is melted and poured and cured, the pipe 18 for cooling can be easily disposed inside the support member 22. Aluminum or the like which has good thermal conductivity and can be easily manufactured by a casting method is an example of the metal material. The resin 17 is configured to be a member that covers the coil 11, the wires 12, the pipe 18 and the through hole 23 of the support member 22, and separates a vacuum sample chamber inside 19 and an atmospheric environment 20 form each other. That is, by sealing the through hole 23 with the resin 17, the airtightness between the vacuum sample chamber inside 19 and the atmospheric environment 20 is ensured.

In the present embodiment, heat generation of the coil 11 can be efficiently suppressed by cooling effect of the cooling fluid, and heat transmitted to the vacuum sample chamber and the movable table can be suppressed, so that deterioration in the processing performance of the vacuum processing apparatus can be prevented. In addition, the present embodiment is also suitable for a linear motor driving with a large current. In addition, the pipe 18 for supplying the cooling fluid for cooling the coil 11 needs to be disposed in the vacuum sample chamber inside 19, the pipe 18 for cooling water of the present embodiment can be airtightly separated from the vacuum sample chamber inside 19 with the resin 17, so that no water leaks into the vacuum sample chamber inside 19 even when there is water leakage from the pipe 18 for water cooling.

Fifth Embodiment

FIG. 7 illustrates the configuration of a peripheral portion of a stator in another embodiment of the invention. With respect to the third embodiment, a position of an O-ring groove 16 provided in a support member 22 is changed, and a stator 3 is attached to a vacuum sample chamber wall 10 from a side of an atmospheric environment 20 in the present embodiment. A sealing surface is formed by machining or the like on an O-ring contact surface of the O-ring groove 16 and an O-ring contact surface of the vacuum sample chamber wall 10.

In the present embodiment, not only singly component replacement can be performed on the stator 3, but also the stator 3 can be attached or detached from the side of the atmospheric environment 20, workability such as maintenance is more excellent.

REFERENCE SIGN LIST

1 Linear motor
2 Sample stage
3 Stator
4 Mover
5 X movable table
6 Y movable table
7 Chunk
8 X roller guide
9 Y roller guide
10 Vacuum sample chamber wall
11 Coil
12 Wire
13 Support member
14 Through hole
15 O-ring
16 O-ring groove
17 Resin
18 Pipe
19 Vacuum sample chamber inside
20 Atmospheric environment
21 Vacuum feed-through
22 Support member
23 Through hole
24 Jacket
25 Bottom surface of sample chamber
26 Heat flow

The invention claimed is:

1. A linear motor for vacuum, comprising: a mover having a permanent magnet; and a stator having a coil covered by a resin member, wherein the stator includes a support member having a vacuum sealing portion that vacuum seals with a wall surface of a vacuum sample chamber and a first through hole portion, and a wire for supplying a current to the coil provided in the vacuum sample chamber, the wire is led out to an outside of the vacuum sample chamber through the first through hole portion, the first through hole portion is filled with the resin member integrally or with a filler that binds to the resin member, so that the first through hole portion is sealed, and the support is on a surface of the vacuum sample chamber and does not enter a second through hole provided in the wall surface of the vacuum sample chamber.

2. The linear motor for vacuum according to claim 1, wherein
the vacuum sealing portion includes an accommodation portion that accommodates an O-ring and a sealing surface in contact with the O-ring.

3. The linear motor for vacuum according to claim 1, wherein
a pipe configured to supply a fluid for cooling the coil is led out to an outside of the vacuum sample chamber through the first through hole portion.

4. The linear motor for vacuum according to claim 1, wherein one of the wire or the wire and a pipe, is led out to the outside of the vacuum sample chamber through the second through hole provided in the wall surface of the vacuum sample chamber.

5. A vacuum processing apparatus comprising:
the linear motor for vacuum according to claim 1, wherein the vacuum sealing portion vacuum seals with the wall surface of the vacuum sample chamber.

* * * * *